(12) United States Patent
Dantz et al.

(10) Patent No.: US 7,279,700 B2
(45) Date of Patent: Oct. 9, 2007

(54) SEMICONDUCTOR SUBSTRATE AND PROCESS FOR PRODUCING IT

(75) Inventors: Dirk Dantz, Koenigslutter am Elm (DE); Andreas Huber, Garching (DE); Reinhold Wahlich, Tittmoning (DE); Brian Murphy, Pfarrkirchen (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 11/266,164

(22) Filed: Nov. 3, 2005

(65) Prior Publication Data

US 2006/0097317 A1    May 11, 2006

(30) Foreign Application Priority Data

Nov. 11, 2004   (DE)   ................. 10 2004 054 564

(51) Int. Cl.
*H01L 29/06*   (2006.01)
(52) U.S. Cl. .................. 257/19; 257/18; 257/190; 257/E29.193
(58) Field of Classification Search ............... None
See application file for complete search history.

(56) References Cited

U.S. PATENT DOCUMENTS

| 5,374,564 A | 12/1994 | Bruel |
| 5,534,713 A * | 7/1996 | Ismail et al. ............. 257/24 |
| 6,524,935 B1 | 2/2003 | Canaperi et al. |
| 2004/0005740 A1 * | 1/2004 | Lochtefeld et al. ........ 438/149 |
| 2004/0142542 A1 * | 7/2004 | Murphy et al. ............ 438/479 |

FOREIGN PATENT DOCUMENTS

| EP | 0 533 551 A1 | 3/1993 |
| EP | 1 365 447 A2 | 11/2003 |
| WO | WO 03/003430 A2 | 1/2003 |
| WO | WO 2004/021420 A2 | 3/2004 |

* cited by examiner

*Primary Examiner*—Evan Pert
*Assistant Examiner*—Scott R Wilson
(74) *Attorney, Agent, or Firm*—Brooks Kushman P.C.

(57) ABSTRACT

A semiconductor substrate useful as a donor wafer is a single-crystal silicon wafer having a relaxed, single-crystal layer containing silicon and germanium on its surface, the germanium content at the surface of the layer being in the range from 10% by weight to 100% by weight, and a layer of periodically arranged cavities below the surface. The invention also relates to a process for producing this semiconductor substrate and to an sSOI wafer produced from this semiconductor substrate.

9 Claims, No Drawings

SEMICONDUCTOR SUBSTRATE AND PROCESS FOR PRODUCING IT

BACKGROUND OF THE INVENTION

1. Field of the Invention

The invention relates to a semiconductor substrate, comprising a relaxed, single-crystal layer containing silicon and germanium which lies at the surface, as well as a process for producing this semiconductor substrate.

2. Background Art

Prior art has disclosed sSOI and SGOI substrates (strained silicon on insulator and silicon-germanium on insulator, respectively). sSOI substrates and SGOI substrates are distinguished by an electrically insulating layer or an electrically insulating support material. In the case of an sSOI substrate, a thin, single-crystal, strained silicon layer is in direct contact with the insulator. By contrast, an SGOI substrate has one or more layers containing silicon and germanium in a predetermined composition ($Si_xGe_{1-x}$ with $0<x<1$) on the insulator. This layer or combination of layers is also referred to below as a "silicon-germanium layer". A thin, single-crystal, strained silicon layer can in turn be applied to the surface of the silicon-germanium layer.

In all the known processes for producing sSOI or SGOI substrates, a thin layer consisting of silicon-germanium is separated from a donor wafer by means of mechanical forces, with the free surface of the layer which is to be transferred usually being bonded to a handle wafer before the separation operation. In the case of the sSOI substrate, in addition to the silicon-germanium layer a strained silicon layer is also transferred from the donor wafer to the handle wafer.

The first step of producing an sSOI or SGOI substrate is to prepare a donor wafer. In both cases, a relaxed silicon-germanium layer must first of all be produced on a silicon wafer, and this silicon-germanium layer is in a further step transferred to the handle wafer. Two fundamentally different processes are known for this purpose:

In the first process, a plurality of silicon-germanium layers with an increasing germanium content (graded buffer layer) are deposited epitaxially on the silicon wafer, thereby producing lattice matching between silicon and silicon-germanium. A silicon-germanium layer with a constant germanium content deposited thereon serves for mechanical stress relief, so that silicon-germanium with its natural lattice constant (i.e. relaxed silicon-germanium with a composition of $Si_xGe_{1-x}$ with $0<x<1$) is present at the surface. The surface roughness which is produced during this process can optionally be reduced by subsequent and/or intervening polishing steps. This process requires the epitaxial deposition of layers with a total thickness of approximately 5 µm and is very expensive on account of the long process time associated therewith. Moreover, the process requires a repeated change between epitaxial deposition and polishing, and therefore a large number of individual process steps. The process leads to dislocation densities in the region of $10^5/cm^2$.

In the second known process, the layer sequence with a gradually increasing germanium content is dispensed with, and instead a thin silicon-germanium layer of the desired composition is deposited immediately. In this case, the layer thickness is kept below the limit beyond which misfit dislocations are formed. This initially still strained silicon-germanium layer is then relaxed by the silicon-crystal bond which is present directly below the silicon-germanium layer being weakened. This is achieved by implantation of gas ions (for example hydrogen or helium ions) and a subsequent heat treatment. During heat treatment, the implanted ions form gas bubbles which break open the silicon-crystal bond and thus mechanically decouple the silicon-germanium layer and a silicon layer beneath it, which is only very thin, from the remainder of the silicon wafer, which ultimately leads to the relaxation of the silicon-germanium layer. One drawback is the complex implantation step and the formation of microcracks during the formation of gas bubbles, which leads to the destruction of the layer. This process also produces a high dislocation density. Only if an sSOI substrate is to be produced a thin, strained silicon layer is additionally deposited epitaxially on the relaxed silicon-germanium layer.

In the second step of this second process, a superficial layer of the donor wafer (a silicon-germanium layer in the case of SGOI and additionally a strained silicon layer in the case of sSOI) is transferred to a handle wafer. The handle wafer either consists entirely of an electrically insulating material or bears an electrically insulating layer at least at its surface. A number of processes are also known for this second step. The most customary is the process known under the name Smart Cute (EP533551A1). In this process, first of all hydrogen ions are implanted into the surface of the donor wafer. After bonding to a handle wafer, a layer with hydrogen-filled cavities is produced by a heat treatment at approximately 500° C. The separation of this layer is effected by an increasing gas pressure.

In all the known processes for producing sSOI or SGOI substrates, the surface roughness produced during separation of the donor wafer along the prepared separating layer is so high that the substrate cannot be used to fabricate electronic components without any further treatment, for example a polishing or a smoothing heat treatment.

SUMMARY OF THE INVENTION

Therefore, an object of the present invention is to provide an efficient method of producing sSOI or SGOI substrates which, on the one hand, does not require the expensive deposition of very thick silicon-germanium layers on the donor wafer, and on the other hand, leads to-a low surface roughness after the thin layer has been transferred to the handle wafer. These and other objects are achieved by providing a semiconductor substrate, comprising a single-crystal silicon wafer, a relaxed, single-crystal layer containing silicon and germanium which lies on the surface, the germanium content at the surface of the layer being in the range from 10% by weight to 100% by weight, and a layer of periodically arranged cavities below said surface.

The thickness of the single-crystal layer is preferably in the range from 5 nm to 3 µm. It is preferable for the germanium content at the surface of the layer to be in the range from 10% by weight to 60% by weight.

The objects are also achieved by a first process for producing a semiconductor substrate, comprising the following steps, in the order given:

production of a layer containing periodically arranged recesses at the surface of a single-crystal silicon wafer, and heat treatment of the single-crystal silicon wafer until a continuous layer consisting of single-crystal silicon has formed at the surface, with a layer of periodically arranged cavities beneath it, wherein after the heat treatment, a single-crystal, relaxed layer with a thickness of from 5 nm to 3 µm, which contains silicon and germanium, is deposited on the continuous layer at the surface, the germanium content at the surface of the relaxed layer being in the range from 10% by weight to 100% by weight.

The objects are also achieved by a second process for producing a semiconductor substrate, comprising the following steps, in the order given:

deposition of a layer containing silicon and germanium on the surface of a single-crystal silicon wafer, the layer being from 5 nm to 3 μm thick and having a germanium content at the surface of the layer in the range from 10% by weight to 100% by weight, production of a layer containing periodically arranged recesses at that surface of the single-crystal silicon wafer which is covered by the layer containing silicon and germanium, and heat treatment of the single-crystal silicon wafer until a continuous, single-crystal, relaxed layer containing silicon and germanium has formed at the surface, with a layer of periodically arranged cavities beneath it.

In this second process, unlike in the first process, the deposition of the layer containing silicon and germanium takes place prior to the production of the recesses and the heat treatment during which the recesses are closed up at the surface. Both processes lead to the semiconductor substrate described.

DETAILED DESCRIPTION OF THE PREFERRED EMBODIMENT(S)

This semiconductor substrate according to the invention can be used as a donor wafer for the production of SGOI substrates. For this purpose, the semiconductor substrate is bonded at the surface which bears the silicon-germanium layer, to a suitable handle wafer, which consists of an electrically insulating material or at least bears an electrically insulating layer at its surface. After the bonding operation, the donor wafer is split along the layer containing the cavities, so that the silicon-germanium layer remains on the handle wafer.

The semiconductor substrate according to the invention can also be used as a donor wafer for the production of sSOI substrates. In this case, a strained silicon layer is deposited on the surface of the layer containing silicon and germanium, beneath which the layer comprising the cavities is located. Then, the semiconductor substrate, at the surface which bears the strained silicon layer, is bonded to a suitable handle wafer, which consists of an electrically insulating material or at least bears an electrically insulating layer at its surface. After the bonding operation, the donor wafer is split along the layer containing the cavities, so that the strained silicon layer and the silicon-germanium layer above it remain on the handle wafer. The silicon-germanium layer can then be removed, so as to produce an sSOI substrate in which a strained silicon layer located at the surface is in direct contact with an electrical insulator.

Therefore, the invention also relates to an sSOI wafer, comprising a handle wafer and a strained silicon layer lying at the surface, the silicon phonon line of the strained silicon layer at room temperature in the Raman spectrum differing by at least 2 $cm^{-1}$, preferably by at least 4 $cm^{-1}$, from the phonon line of unstrained silicon, and the strained silicon layer being 50 nm or less thick, having a layer thickness uniformity (6σ) of 5% or less and having an HF defect density of 1/$cm^2$ or less.

The position of the silicon phonon line in the Raman spectrum at room temperature is a direct measure of the degree of straining of the silicon layer. The silicon phonon line of an unstrained silicon layer is 520 $cm^{-1}$ at room temperature. The position of the silicon phonon line is shifted by about 8 $cm^{-1}$ in a strained silicon layer with 1% lattice mismatch (strain).

The semiconductor substrate according to the invention bears a very thin, single-crystal, relaxed layer containing silicon and germanium at its surface. On account of the lattice mismatch between substantially pure silicon and silicon-germanium, stresses are formed in the crystal lattice which are compensated for by plastic deformation, i.e. by the formation of dislocations. The layer comprising cavities located directly beneath the silicon-germanium layer is less mechanically stable than the silicon-germanium layer itself. Therefore, the stresses in the crystal lattice are primarily reduced by the formation of dislocations in the webs of material which are present between the cavities and bond the layer to the remainder of the substrate. This in turn means that the silicon-germanium layer on the one hand relaxes even at a low thickness through the formation of dislocations. On the other hand, however, these dislocations are predominantly formed in the webs of material between the cavities and in an optional thin silicon layer which may be present between the layer comprising the cavities and the silicon-germanium layer. Consequently, the dislocation density in the silicon-germanium layer itself is considerably lower than in the case of silicon-germanium layers of the prior art which are of the same thickness. Consequently, the silicon-germanium layer of the donor wafer according to the invention can be considerably thinner than in accordance with the prior art, so that the layer can be produced considerably more quickly and therefore at lower cost without having to accept an increase in the dislocation density.

The semiconductor substrate according to the invention is produced without ion implantation. Microcracks caused by the formation of gas bubbles and an associated destruction of the layer containing silicon and germanium can therefore be avoided.

Preferred embodiments for the individual steps of the invention are presented below:

The silicon-germanium layer is preferably produced by epitaxial deposition. CVD (chemical vapor deposition) by the decomposition of suitable gaseous starting compounds containing silicon and/or germanium at the hot surface of the substrate in a CVD reactor is particularly preferred.

According to the invention, the recesses in the silicon or silicon-germanium surface are arranged periodically. They can be produced, for example, by lithography and trench etching (cf. for example WO03/003430A2).

The heat treatment for closing up the recesses at the surface is generally carried out at a temperature in the range from 700 to 1370° C., preferably 900 to 1250° C., and most preferably 950 to 1150° C., and at a pressure in the range from 1 to 100 Torr, preferably 1 to 50 Torr and most preferably 5 to 20 Torr. The heat treatment can be carried out in all atmospheres which prevent the formation of an oxide layer (native oxide) on the silicon or silicon-germanium surface, preferably in reducing gases and gas mixtures or inert gases and gas mixtures. An atmosphere which contains hydrogen or argon or mixtures of hydrogen and argon is preferred. The process conditions are selected in such a way that it is possible to achieve the highest possible surface mobility of the silicon or germanium atoms. The heat treatment generally lasts from 3 seconds to 6 hours, preferably from 1 minute to 30 minutes. The duration of the heat treatment is controlled in such a way that after it has ended, the recesses are closed off at the surface but the individual cavities formed from the individual recesses have not yet merged into one another.

The strained silicon layer which is required for some embodiments of the invention is likewise preferably produced by epitaxial deposition. CVD deposition through the decomposition of suitable gaseous starting compounds containing silicon at the hot silicon-germanium surface of the substrate in a CVD reactor is particularly preferred.

The semiconductor substrate according to the invention is preferably used as a donor wafer for layer transfer. For this purpose, the semiconductor substrate is bonded to a handle wafer at the prepared surface which bears the layer to be transferred, in a conventional manner. When producing SGOI or sSOI substrates, either an electrically insulating handle wafer (for example consisting of quartz, glass or sapphire) is used, or the surface of the donor wafer and/or of the handle wafer is provided with an insulating layer, for example an oxide layer, prior to the bonding operation. It is preferable for the handle wafer used to be a silicon wafer, in particular a single-crystal silicon wafer, the surface of which is oxidized, so that a silicon oxide layer forms the electrically insulating layer. Processes for producing this insulating layer and for bonding wafers are known to those skilled in the art.

To complete the transfer of the layer, the semiconductor substrate which has been bonded to the handle wafer is then split along the layer containing cavities. The split may be produced, for example, by chemical, mechanical or thermal means. These options may also be combined. The processes are described in more detail in WO03/003430A2. It is preferable for the split to be effected thermally, since this is a particularly gentle process which leads to a low roughness of the surfaces formed during the split. Moreover, if necessary, the heat treatment, at the same time, boosts the bonding force between the handle wafer and semiconductor substrate. The conditions used for the thermal splitting are likewise described in more detail in WO03/003430A2.

All the processes which have been disclosed hitherto for transferring silicon-germanium layers or strained silicon layers use mechanical forces in part or exclusively to separate the donor wafer from the thin layer that is to be transferred. In the case of the technology known by the name Smart Cut®, for example, these forces are generated by gas pressure, which ultimately causes the walls or webs of material between the cavities to break open. Unlike these known processes for the production of SGOI or sSOI wafers, if the donor wafer prepared in accordance with the invention is used, and in the case of the preferred embodiment described above (splitting along the layer comprising the cavities by means of a heat treatment), no mechanical forces are used to separate the layers to be transferred. As a result of splitting by heat treatment, on the one hand a very good layer thickness uniformity (6σ; i.e. the value of the standard deviation from the mean layer thickness multiplied by six) of 5% or less (based on the mean layer thickness) is achieved for a layer thickness of 50 nm or less, and on the other hand the density of the HF defects can be reduced compared to the known processes, to $1/cm^2$ or less.

The text which follows describes preferred embodiments for the sequence of individual steps used in the process according to the invention:

Preferred Process Sequence 1 (Production of an SGOI Substrate):
1. Production of a layer containing periodically arranged recesses at the surface of a single-crystal silicon wafer.
2. Heat treatment of the single-crystal silicon wafer until a continuous layer consisting of single-crystal silicon with a layer of periodically arranged cavities beneath it has formed at the surface.
3. Deposition of a single-crystal, relaxed layer with a thickness of from 5 nm to 3 μm, which contains silicon and germanium, the germanium content being in the range from 10 to 60% by weight. The stresses which form in the crystal lattice are relieved via the thin webs of material between the cavities. The wafer which has been prepared in this manner is used as a donor wafer.
4. Oxidation of the surface of the silicon-germanium layer of the donor wafer or oxidation of the surface of the handle wafer.
5. Bonding of the donor wafer to the handle wafer.
6. Heat treatment for increasing the bonding force and for separating the thin silicon-germanium layer from the donor wafer.

Preferred Process Sequence 2 (Production of an sSOI Substrate):
1. Production of a layer containing periodically arranged recesses at the surface of a single-crystal silicon wafer.
2. Heat treatment of the single-crystal silicon wafer until a continuous layer consisting of single-crystal silicon with a layer of periodically arranged cavities beneath it has formed at the surface.
3. Deposition of a single-crystal, relaxed layer with a thickness of from 5 nm to 3 μm, which contains silicon and germanium, the germanium content being in the range from 10 to 60% by weight. The stresses which form in the crystal lattice are relieved via the thin webs of material between the cavities.
4. Deposition of a strained silicon layer on the relaxed silicon-germanium layer. The wafer which has been prepared in this manner is used as donor wafer.
5. Oxidation of the surface of the strained silicon layer of the donor wafer or oxidation of the surface of the handle wafer.
6. Bonding of the donor wafer to the handle wafer.
7. Heat treatment to increase the bonding force and to separate the thin silicon-germanium layer and the strained silicon layer from the donor wafer.

Preferred Process Sequence 3 (Production of an SGOI Substrate):
1. Deposition of a single-crystal, relaxed layer with a thickness of from 5 nm to 3 μm, which contains silicon and germanium, the germanium content being in the range from 10 to 60% by weight, on a single-crystal silicon wafer. This silicon-germanium layer is not completely relaxed, on account of its low thickness.
2. Production of periodically arranged recesses at the surface of the silicon-germanium layer.
3. Heat treatment of the single-crystal silicon wafer with the silicon-germanium layer, until a continuous layer consisting of single-crystal silicon-germanium with a layer of periodically arranged cavities beneath it has formed at the surface. During this heat treatment, the silicon-germanium layer relaxes as a result of the formation of dislocations in the webs of material between the cavities. The wafer which has been prepared in this manner is used as donor wafer.
4. Oxidation of the surface of the silicon-germanium layer of the donor wafer or oxidation of the surface of the handle wafer.
5. Bonding of the donor wafer to the handle wafer.

6. Heat treatment for increasing the bonding force and for separating the thin silicon-germanium layer from the donor wafer.

Preferred Process Sequence 4 (Production of an sSOI Substrate):
1. Deposition of a single-crystal, relaxed layer with a thickness of from 5 nm to 3 µm, which contains silicon and germanium, the germanium content being in the range from 10 to 60% by weight, on a single-crystal silicon wafer. This silicon-germanium layer is not completely relaxed, on account of its low thickness.
2. Production of periodically arranged recesses at the surface of the silicon-germanium layer.
3. Heat treatment of the single-crystal silicon wafer with the silicon-germanium layer, until a continuous layer consisting of single-crystal silicon-germanium with a layer of periodically arranged cavities beneath it has formed at the surface. During this heat treatment, the silicon-germanium layer relaxes as a result of the formation of dislocations in the webs of material between the cavities.
4. Deposition of a strained silicon layer on the relaxed silicon-germanium layer. The wafer which has been prepared in this manner is used as donor wafer.
5. Oxidation of the surface of the strained silicon layer of the donor wafer or oxidation of the surface of the handle wafer.
6. Bonding of the donor wafer to the handle wafer.
7. Heat treatment for increasing the bonding force and for separating the thin silicon-germanium layer and the strained silicon layer from the donor wafer.

In all the processes described above, the separation of the thin layer from the donor wafer can also be carried out with the assistance of mechanical forces.

EXAMPLES

Example 1

Periodically arranged recesses with a round cross section were produced in the surface of a single-crystal silicon wafer by means of lithography and ion beam etching in accordance with the prior art. The depth of the recesses was 3.5 µm, their diameter was 0.4 µm and the center-to-center distance of the recesses was 0.8 µm. Then, the recesses were closed up by a heat treatment at 1100° C. and 10 Torr in a hydrogen atmosphere, so as to form a thin single-crystal silicon layer and a layer of periodically arranged cavities beneath it. The heat treatment lasted for 10 minutes. Next, a silicon-germanium layer was deposited epitaxially on the newly formed single-crystal silicon surface. In a further step, the silicon-germanium layer of the donor wafer which had been prepared in this manner was bonded to a silicon wafer with an oxidized surface. A commercially available bonder was used for this purpose. The pair of wafers which had been bonded to one another was then subjected to a heat treatment lasting a total of 10 hours with a maximum temperature of 1100° C. The pressure was 760 Torr, and the atmosphere gas selected was argon. This heat treatment increased the strength of the bonding between the two wafers. Moreover, as the heat treatment continued, the individual cavities formed from the recesses fused together so as to form one continuous cavity which separated the silicon-germanium layer from the remainder of the donor wafer. The silicon layer which was now arranged above the silicon-germanium layer was oxidized and the oxide layer was then removed. The thin, single-crystal silicon-germanium layer was then bonded only to the oxide layer, resulting in an SGOI substrate.

Example 2

Periodically arranged recesses with a round cross section were produced in the surface of a single-crystal silicon wafer by means of lithography and ion beam etching in accordance with the prior art. Then, the recesses were closed up by a heat treatment at 1100° C. and 10 Torr in a hydrogen atmosphere, so as to form a thin single-crystal silicon layer and a layer of periodically arranged cavities beneath it. The heat treatment lasted for 10 minutes. Next, a silicon-germanium layer was epitaxially deposited on the newly formed single-crystal silicon surface, and a strained silicon layer was in turn deposited epitaxially on the silicon-germanium layer. In a further step, the strained silicon layer of the donor wafer which had been prepared in this manner was bonded to a silicon wafer with an oxidized surface. A commercially available bonder was used for this purpose. The pair of wafers which had been bonded to one another was then subjected to a heat treatment lasting a total of 10 hours and with a maximum temperature of 1100° C. The pressure was 760 Torr and the atmosphere gas selected was Ar. This heat treatment increased the strength of the bonding between the two wafers. Moreover, as the heat treatment continued, the individual cavities formed from the recesses fused together so as to form one continuous cavity which separated the silicon-germanium layer and the strained silicon layer from the remainder of the donor wafer. The silicon layer which was now arranged above the silicon-germanium layer and the silicon-germanium layer itself were oxidized, and the oxide layer was then removed. The thin, single-crystal strained silicon layer was then bonded only to the oxide layer, resulting in an sSOI substrate.

Example 3

A silicon-germanium layer with a thickness of approx. 2 µm was deposited on the surface of a single-crystal silicon wafer. Periodically arranged recesses with a round cross section were produced on the surface of this silicon-germanium layer by means of lithography and ion beam etching in accordance with the prior art. The depth of the recesses was 1.7 µm, their diameter was 0.2 µm and the center-to-center distance of the recesses was 0.4 µm. The recesses were then closed up by a heat treatment at 1100° C. and 10 Torr in a hydrogen atmosphere, so as to form a thin single-crystal silicon-germanium layer and a layer of periodically arranged cavities beneath it. The heat treatment lasted for 10 minutes. In a further step, the silicon-germanium layer of the donor wafer which had been prepared in this manner was bonded to a silicon wafer with an oxidized surface. A commercially available bonder was used for this purpose. The pair of wafers which had been bonded to one another was then subjected to a heat treatment lasting a total of 10 hours with a maximum temperature of 1100° C. The pressure was 10 Torr and the atmosphere gas selected was argon. This heat treatment increased the strength of the bonding between the two wafers. Moreover, as the heat treatment continued, the individual cavities formed from the recesses fused together so as to form one continuous cavity which separated the silicon-germanium layer from the remainder of the donor wafer. The silicon layer which was then arranged above the silicon-germanium layer was oxidized and the oxide layer was then removed. The thin, single-crystal silicon-germanium layer was then only bonded to the oxide layer, resulting in an SGOI substrate. The transferred silicon-germanium layer had a thickness of approx. 1 µm.

Example 4

A silicon-germanium layer with a thickness of approx. 2 µm was epitaxially deposited on the surface of a single-crystal silicon wafer. Periodically arranged recesses with a round cross section were produced on the surface of this silicon-germanium layer by means of lithography and ion beam etching in accordance with the prior art. The depth of the recesses was 1.7 µm, their diameter was 0.2 µm and the center-to-center distance of the recesses was 0.4 µm. Then, the recesses were closed up by a heat treatment at 1100° C. and 10 Torr in a hydrogen atmosphere, so as to form a thin single-crystal silicon-germanium layer and a layer of periodically arranged cavities beneath it. The heat treatment lasted for 10 minutes. A silicon layer with a thickness of 50 nm was deposited epitaxially on the relaxed silicon-germanium layer; on account of the different lattice parameters compared to the silicon-germanium layer beneath it, this silicon layer was strained. In a further step, the strained silicon layer of the donor wafer which had been prepared in this manner was bonded to a silicon wafer with an oxidized surface. A commercially available bonder was used for this purpose. The pair of wafers which had been bonded to one another was then subjected to a heat treatment lasting a total of 10 hours with a maximum temperature of 1100° C. The pressure was 10 Torr and the atmosphere gas selected was Ar. This heat treatment increased the strength of the bonding between the two wafers. Moreover, as the heat treatment continued, the individual cavities formed from the recesses fused together so as to form one continuous cavity which separated the silicon-germanium layer and the strained silicon layer from the remainder of the donor wafer. The total thickness of the transferred layer was approx. 1.05 µm. The silicon layer which was now arranged above the silicon-germanium layer and the silicon-germanium layer itself were oxidized, and then the oxide layer was removed. The thin, single-crystal strained silicon layer was then bonded only to the oxide layer, resulting in an sSOI substrate.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A semiconductor substrate comprising a single-crystal silicon wafer, having deposited thereon a relaxed, single-crystal surface layer containing germanium or germanium and silicon with a germanium content of the surface layer being in the range from 10% by weight to 100% by weight, and a layer of periodically arranged cavities below said surface layer.

2. The semiconductor substrate of claim 1, wherein the single-crystal surface layer is from 5 nm to 3 µm thick.

3. The semiconductor substrate of claim 1, further comprising an oxidized layer on said relaxed, single crystal layer, said oxidized layer bonded to a handle wafer.

4. The semiconductor substrate of claim 1, wherein said relaxed, single crystal layer is bonded to an oxidized surface of a handle wafer.

5. An sSOI wafer, comprising a handle wafer and a strained silicon layer lying at the surface, the silicon phonon line of the strained silicon layer at room temperature in the Raman spectrum differing by at least 2 $cm^{-1}$ from the phonon line of unstrained silicon, and the strained silicon layer being 50 nm or less thick, having a layer thickness uniformity (6σ) of 5% or less and having an HF defect density of $1/cm^2$ or less.

6. The sSOI wafer of claim 5, wherein the silicon phonon line of the strained silicon layer at room temperature in the raman spectrum differs by at least 4 $cm^{-1}$ from the phonon line of unstrained silicon.

7. The sSOI wafer of claim 5, wherein a strained silicon layer comprising silicon is epitaxially deposited over a germanium or silicon and germanium single crystal layer on said single-crystal silicon wafer containing germanium in a range of 10% by weight to 100% by weight.

8. The sSOI wafer of claim 7, wherein the germanium or silicon and germanium single crystal layer is from 5 nm to 3 µm thick.

9. An sSOI wafer of claim 5, wherein a strained silicon layer having a thickness of 50 nm or less is epitaxially deposited onto a germanium or germanium and silicon layer containing at least 10% by weight germanium, the germanium or germanium and silicon layer located on a surface of a single-crystal silicon wafer and having a layer of periodically arranged cavities below said germanium or germanium and silicon layer; the strained silicon layer is bonded to an insulator layer disposed on a handle wafer of semiconductor material to produce a bonded wafer structure, the bonded wafer structure is heated and the germanium or germanium and silicon layer is separated from the single-crystal silicon wafer along the layer of cavities; and the germanium or germanium and silicon layer is removed from the handle wafer, producing a handle wafer having a strained silicon layer of 50 nm or less thickness and having a thickness variation (6σ) of no more than 5%.

* * * * *